United States Patent
Samejima

(10) Patent No.: US 10,342,145 B2
(45) Date of Patent: Jul. 2, 2019

(54) SUBSTRATE HOLDING STRUCTURE

(71) Applicant: Yazaki Corporation, Tokyo (JP)

(72) Inventor: Masakuni Samejima, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/112,794

(22) Filed: Aug. 27, 2018

(65) Prior Publication Data

US 2019/0090365 A1 Mar. 21, 2019

(30) Foreign Application Priority Data

Sep. 15, 2017 (JP) ................. 2017-177959

(51) Int. Cl.
| | |
|---|---|
| *H05K 5/00* | (2006.01) |
| *H01R 25/00* | (2006.01) |
| *H01R 12/70* | (2011.01) |
| *H01R 12/72* | (2011.01) |
| *H01R 12/58* | (2011.01) |

(52) U.S. Cl.
CPC ....... *H05K 5/0069* (2013.01); *H01R 12/7023* (2013.01); *H01R 12/7064* (2013.01); *H01R 25/006* (2013.01); *H05K 5/0008* (2013.01); *H05K 5/0043* (2013.01); *H01R 12/585* (2013.01); *H01R 12/724* (2013.01)

(58) Field of Classification Search
None
See application file for complete search history.

(56) References Cited

U.S. PATENT DOCUMENTS

| | | | | |
|---|---|---|---|---|
| 7,358,438 | B2 * | 4/2008 | Zoller | B60R 16/0239 |
| | | | | 174/50 |
| 7,697,300 | B2 * | 4/2010 | Brandt | B60R 16/0239 |
| | | | | 361/704 |
| 9,781,850 | B1 * | 10/2017 | Currier | H05K 5/0069 |
| 2003/0206392 | A1 * | 11/2003 | Kawata | H05K 1/0203 |
| | | | | 361/631 |
| 2005/0047095 | A1 * | 3/2005 | Tomikawa | H05K 3/284 |
| | | | | 361/715 |
| 2008/0286988 | A1 | 11/2008 | Yanai et al. | |
| 2014/0087586 | A1 * | 3/2014 | O'Connell | H05K 1/181 |
| | | | | 439/527 |

(Continued)

FOREIGN PATENT DOCUMENTS

JP 2008-235855 A 10/2008

*Primary Examiner* — Xanthia C Cunningham
(74) *Attorney, Agent, or Firm* — Kenealy Vaidya LLP

(57) ABSTRACT

Disclosed is a substrate holding structure including: a cylindrical side wall portion that forms an accommodating space; a holding wall portion protruding inward of the accommodating space from the side wall portion; a plurality of press fit terminals held by the holding wall portion, protruding toward an opening of the side wall portion, and pressedly inserted into holes of a substrate accommodated in the accommodating space; and a flexible arm portion protruding toward the opening from a position closer to the side wall portion than the press fit terminals of the holding wall portion, have flexibility, and having a hook portion configured to lock a surface on the opening side of the substrate, wherein distal end positions of the press fit terminals and the arm portion are closer to the holding wall portion than an end surface on the opening side of the side wall portion.

8 Claims, 10 Drawing Sheets

(56) References Cited

U.S. PATENT DOCUMENTS

| | | | | |
|---|---|---|---|---|
| 2015/0280353 A1* | 10/2015 | Xiao | ................... | H01R 13/46 |
| | | | | 439/607.01 |
| 2015/0331087 A1* | 11/2015 | Philipp | ............... | H05K 5/0069 |
| | | | | 342/175 |
| 2016/0031398 A1* | 2/2016 | Azuma | ................ | B60R 21/01 |
| | | | | 361/752 |
| 2018/0213658 A1* | 7/2018 | Nuriya | ............... | H05K 1/0203 |

* cited by examiner

SUBSTRATE HOLDING STRUCTURE

CROSS-REFERENCE TO RELATED APPLICATION(S)

The present application claims priority to and incorporates by reference the entire contents of Japanese Patent Application No. 2017-177959 filed in Japan on Sep. 15, 2017.

BACKGROUND OF THE INVENTION

1. Field of the Invention

The present invention relates to a substrate holding structure.

2. Description of the Related Art

In the related art, there is known a structure for holding a board using a casing or the like. Japanese Patent Application Laid-open No. 2008-235855 discusses a technique of an electronic control unit including a circuit board, a casing that holds the circuit board, and a plurality of busbars fixed to the casing through insert molding. In the technique of Japanese Patent Application Laid-open No. 2008-235855, the circuit board is fixed to the casing using a plug type post having a loosening prevention function.

There is a demand for improvement in the substrate holding structure. For example, it is desirable to more reliably hold and retain the substrate. For example, it is desirable to suitably protect the substrate holding portion.

SUMMARY OF THE INVENTION

An object of the invention is to provide a substrate holding structure capable of suitably holding the substrate. Another object of the invention is to provide a substrate holding structure capable of suitably protecting the substrate holding portion.

In order to achieve the above mentioned object, a substrate holding structure according to one aspect of the present invention includes a cylindrical side wall portion that forms an accommodating space; a holding wall portion protruding inward of the accommodating space from the side wall portion; a plurality of press fit terminals held by the holding wall portion, protruding toward an opening of the side wall portion, and pressedly inserted into holes of a substrate accommodated in the accommodating space; and a flexible arm portion protruding toward the opening from a position closer to the side wall portion than the press fit terminals of the holding wall portion, and having a hook portion configured to lock a surface on the opening side of the substrate, wherein distal end positions of the press fit terminals and the arm portion are located closer to the holding wall portion than an end surface on the opening side of the side wall portion.

According to another aspect of the present invention, in the substrate holding structure, it is preferable that a stopper portion that restricts movement of the substrate toward the holding wall portion side beyond a predetermined position.

According to still another aspect of the present invention, in the substrate holding structure, it is preferable that the arm portion is inclined with respect to an insertion direction of the substrate toward the accommodating space such that the arm portion is directed inward of the accommodating space as it extends from the holding wall portion toward the opening.

According to still another aspect of the present invention, in the substrate holding structure, it is preferable that the arm portion abuts the side wall portion in a state where a deformation amount of the arm portion is within an elastic deformation range when the arm portion is pressed toward the side wall portion.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A substrate holding structure and an electrical connection box according to an embodiment of the invention will now be described in details with reference to the accompanying drawings. Note that the following embodiments are not intended to limit the scope of the invention. In addition, elements described in the following embodiments may also include those easily anticipated by a person ordinarily skilled in the art or substantial equivalents thereof.

Embodiment

Figure 1:
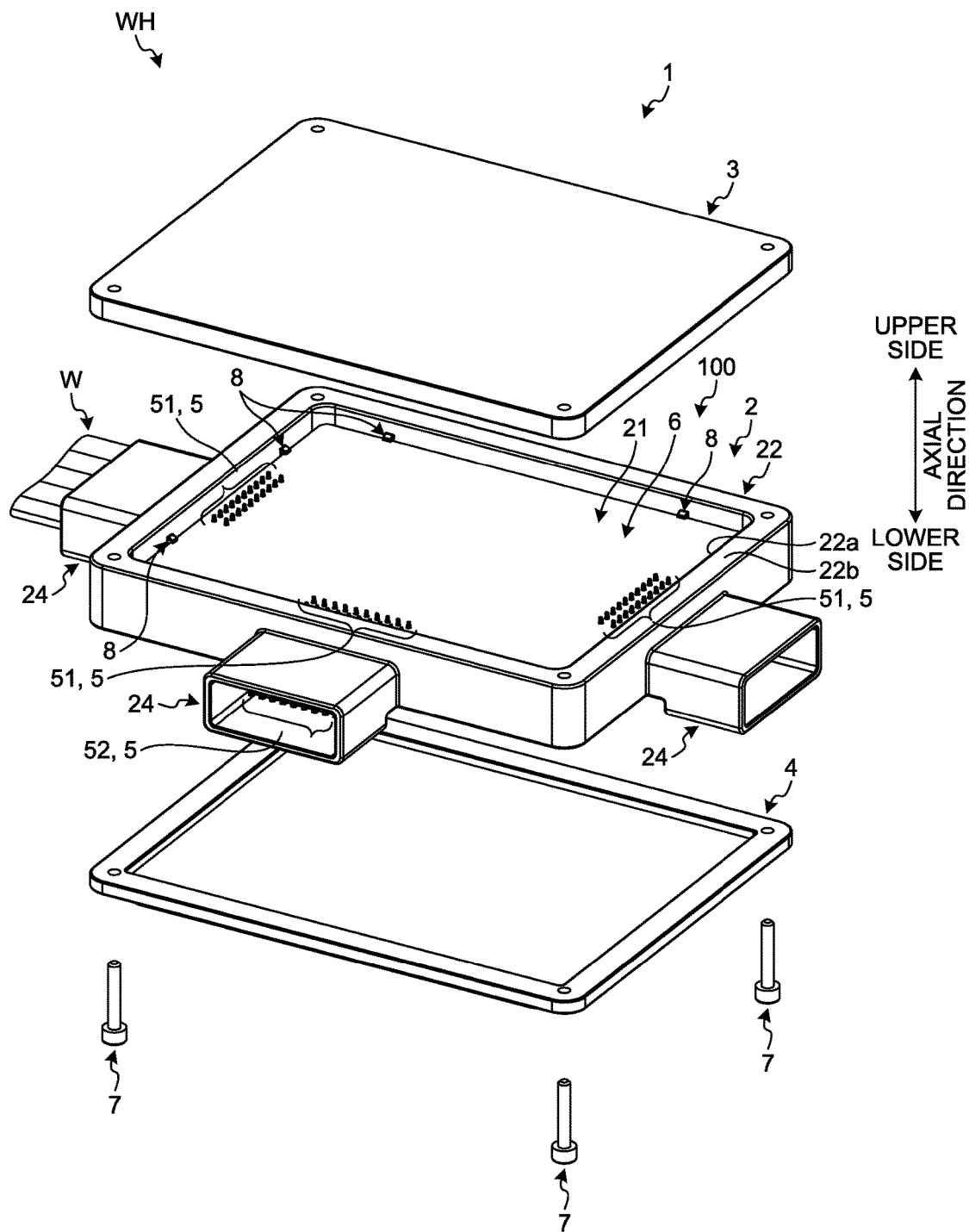
FIG. 1 is a perspective view illustrating an electrical connection box according to an embodiment.
Figure 2:
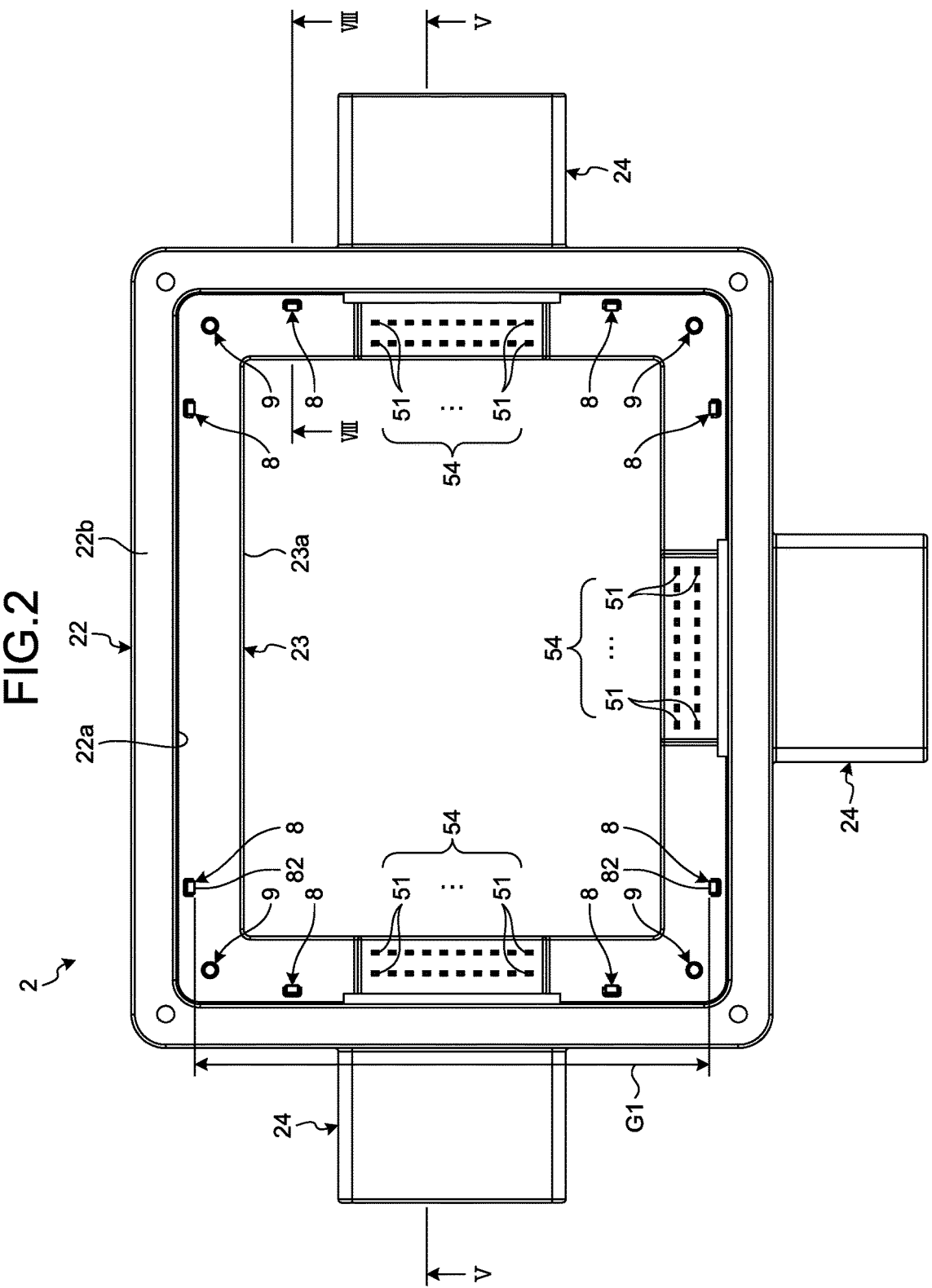
FIG. 2 is a plan view illustrating a frame according to an embodiment.
Figure 3:
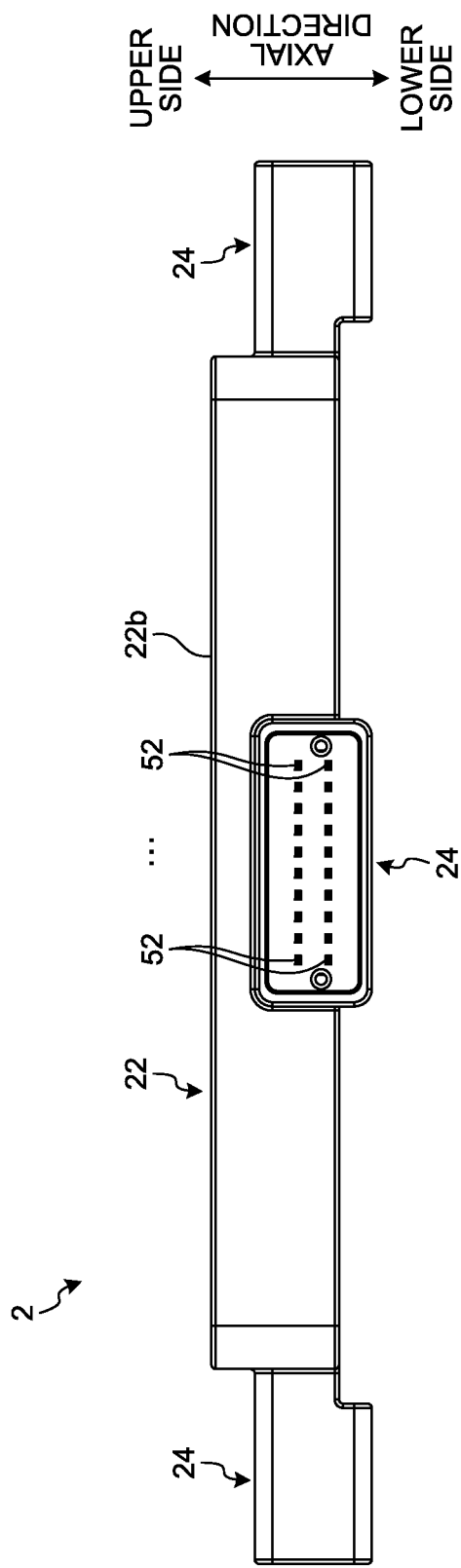
FIG. 3 is a side view illustrating a frame according to an embodiment.
Figure 4:
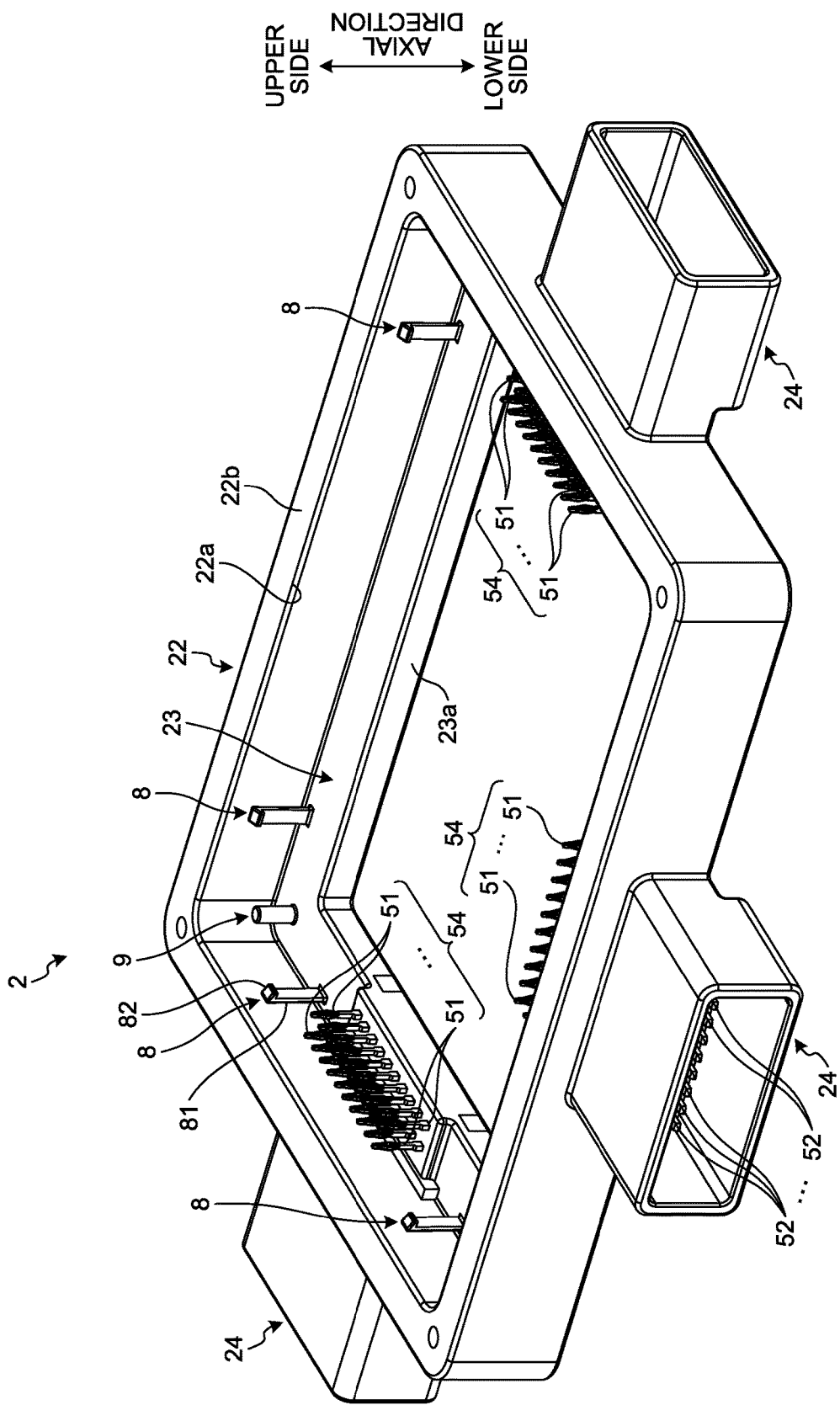
FIG. 4 is a perspective view illustrating a frame according to an embodiment.
Figure 5:
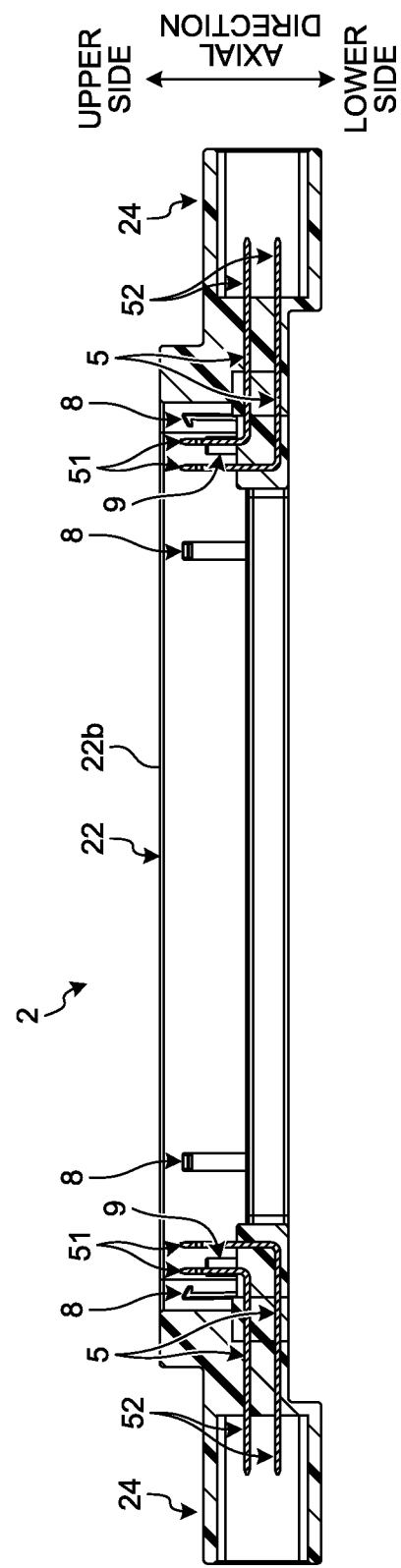
FIG. 5 is a cross-sectional view illustrating a frame according to an embodiment.
Figure 6:
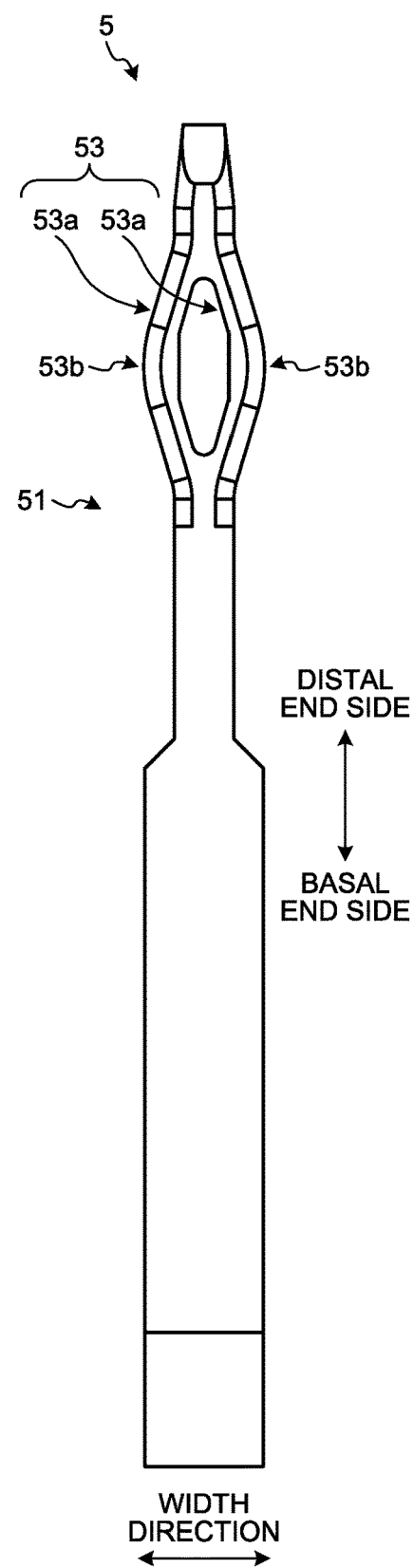
FIG. 6 is a front view illustrating a press fit terminal according to an embodiment.
Figure 7:
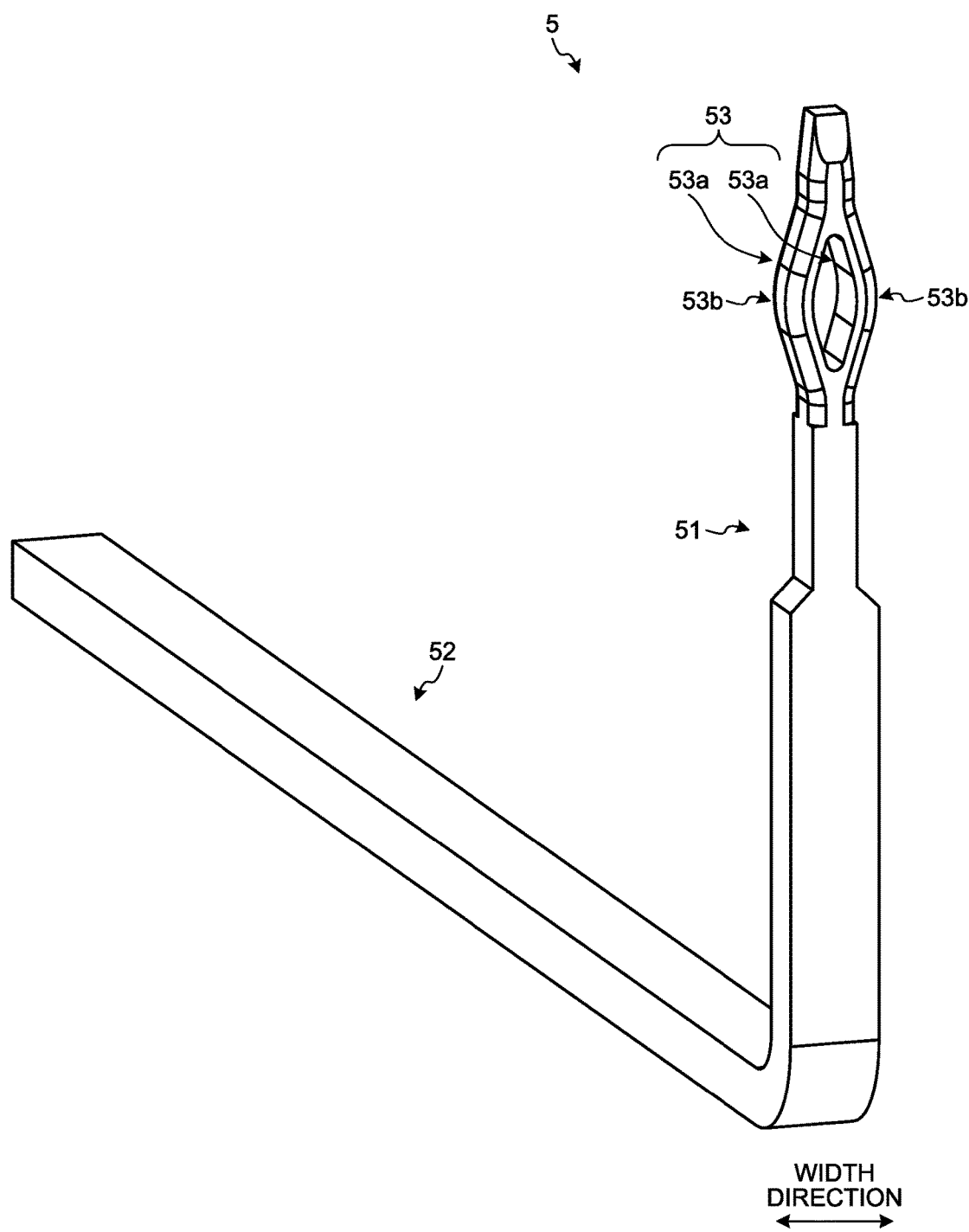
FIG. 7 is a perspective view illustrating a press fit terminal according to an embodiment.
Figure 8:
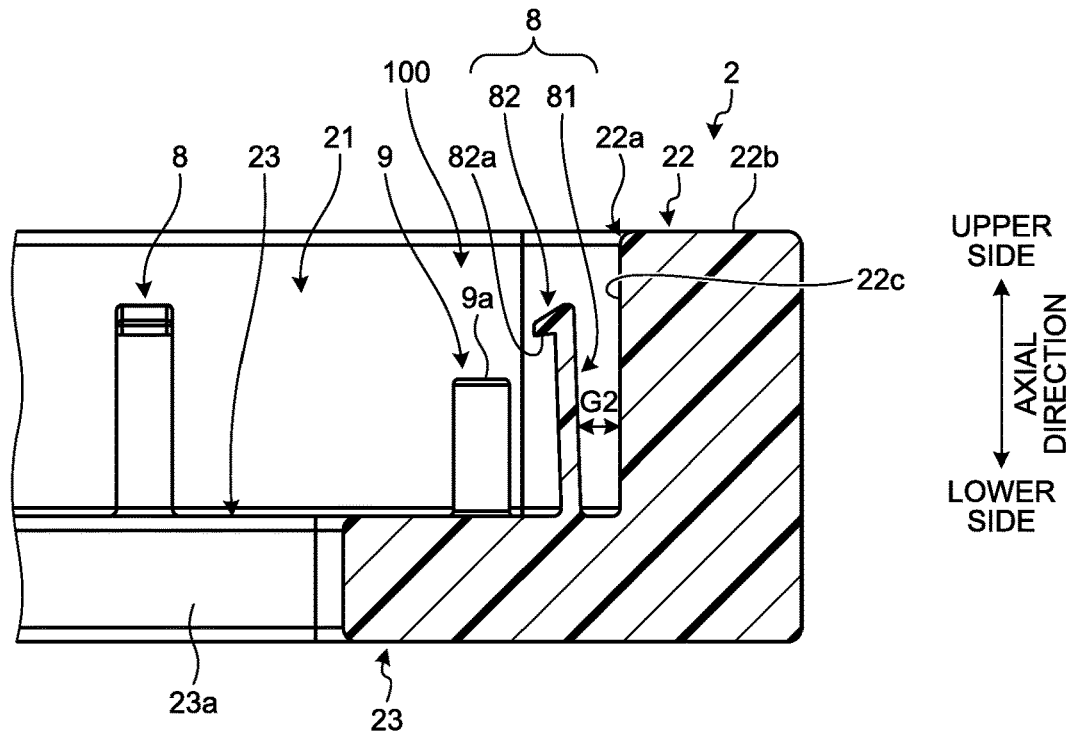
FIG. 8 is a cross-sectional view illustrating main parts of the frame according to an embodiment.
Figure 9:
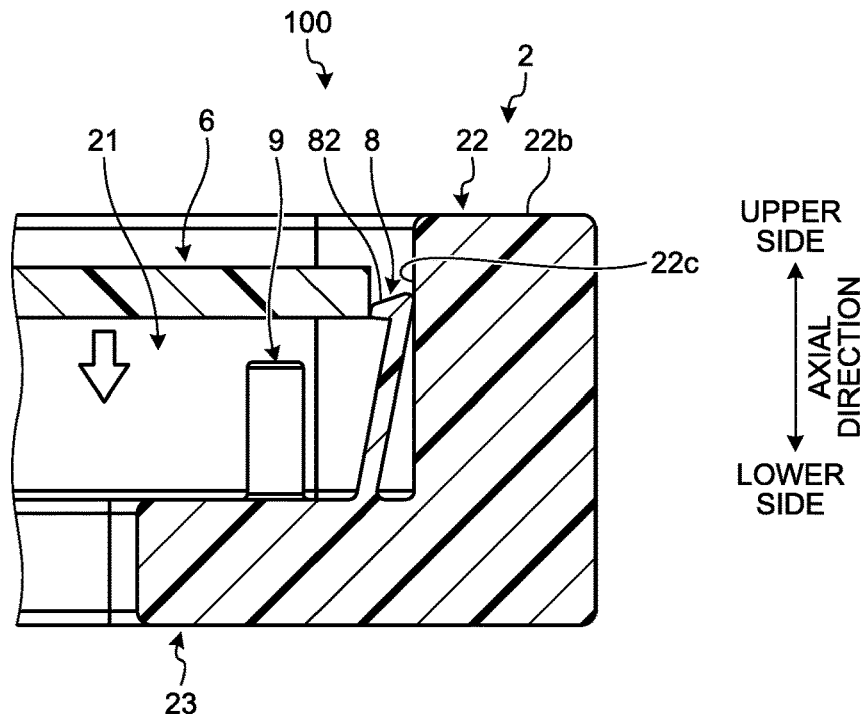
FIG. 9 is a cross-sectional view illustrating deformation of the arm portion according to an embodiment.
Figure 10:
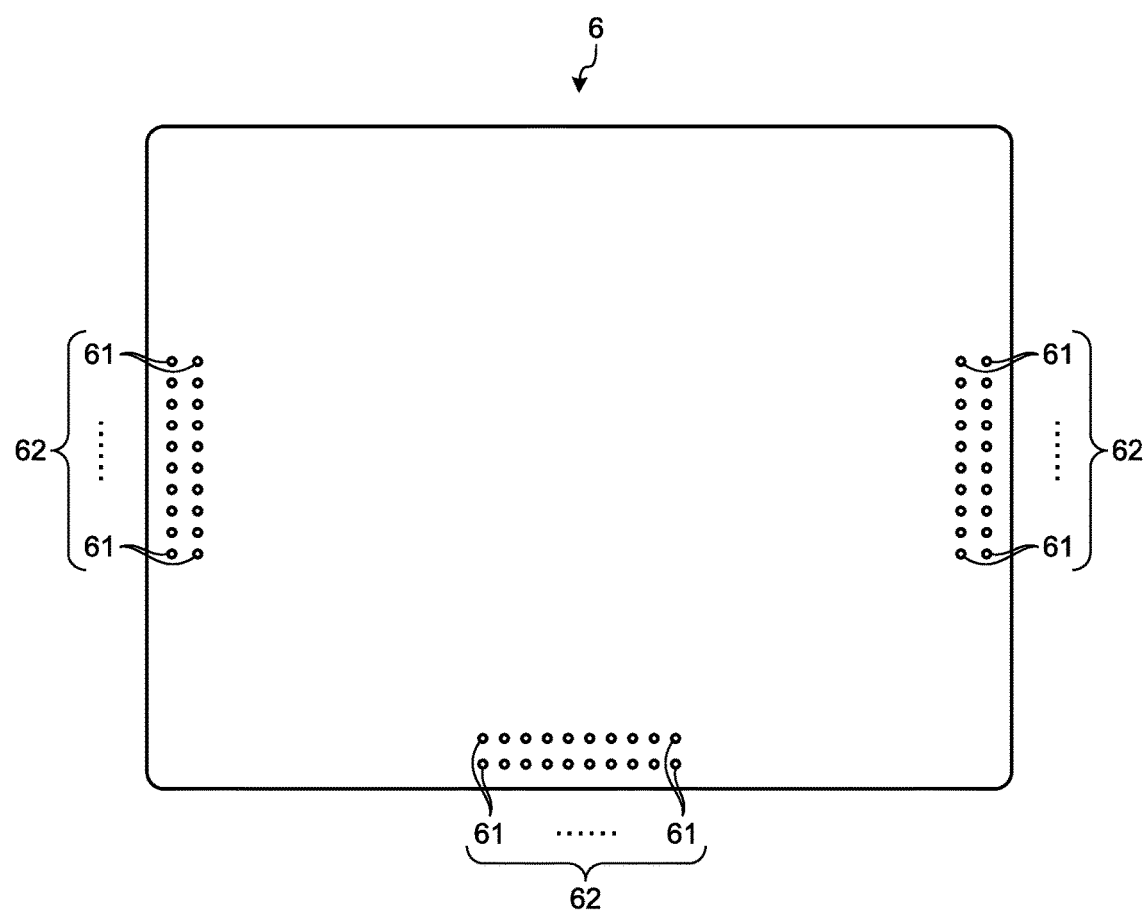
FIG. 10 is a plan view illustrating a substrate according to an embodiment.
Figure 11:
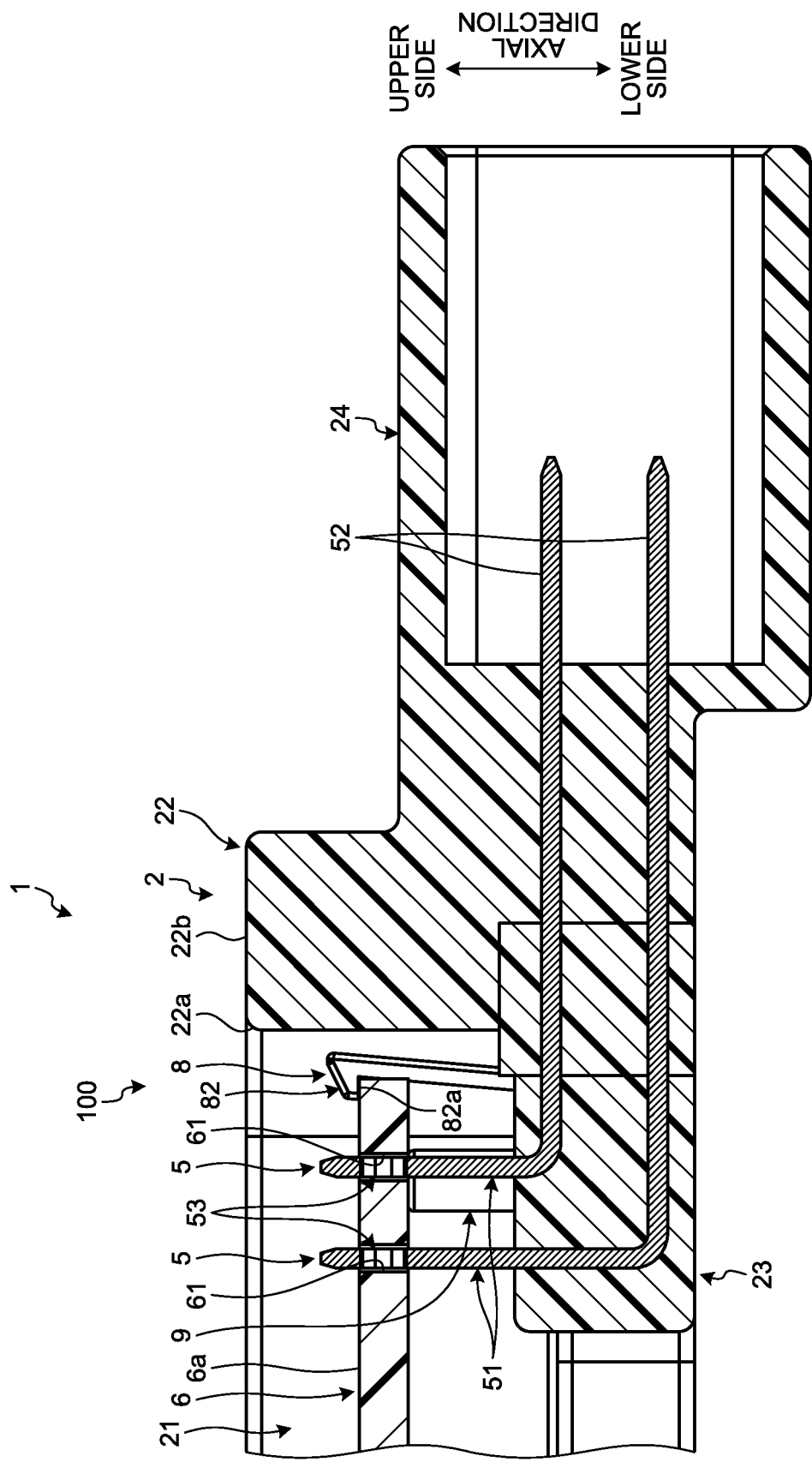
FIG. 11 is a cross-sectional view illustrating an electrical connection box according to an embodiment.

An embodiment of the invention will now be described with reference to FIGS. 1 to 11. This embodiment relates to a substrate holding structure and an electrical connection box. FIG. 1 is a perspective view illustrating an electrical connection box according to an embodiment. FIG. 2 is a plan view illustrating a frame according to an embodiment. FIG. 3 is a side view illustrating a frame according to an embodiment. FIG. 4 is a perspective view illustrating a frame according to an embodiment. FIG. 5 is a cross-sectional view illustrating a frame according to an embodiment. FIG. 6 is a front view illustrating a press fit terminal according to an embodiment. FIG. 7 is a perspective view illustrating a press fit terminal according to an embodiment. FIG. 8 is a cross-sectional view illustrating main parts of the frame according to an embodiment. FIG. 9 is a cross-sectional view illustrating deformation of an arm portion according to an embodiment. FIG. 10 is a plan view illustrating a substrate according to an embodiment. FIG. 11 is a cross-sectional view illustrating an electrical connection box according to an embodiment. FIG. 5 illustrates a cross section taken along a line V-V of FIG. 2. FIG. 8 illustrates a cross section taken along a line VIII-VIII of FIG. 2. FIG. 11 illustrates a cross section of the electrical connection box in the same cross-sectional position as that of FIG. 5.

As illustrated in FIG. 1, a substrate holding structure 100 according to this embodiment is a structure for holding a substrate 6 in the electrical connection box 1. The electrical connection box 1 according to this embodiment includes a frame 2, an upper cover 3, a lower cover 4, a press fit terminal 5, a substrate 6, and a fastening member 7. The electrical connection box 1 forms a wire harness WH along with electric wires W.

The frame 2 has an accommodating space 21 for accommodating the substrate 6. The substrate 6 is electrically connected to a first connecting portion 51 of the press fit terminal 5. The press fit terminal 5 is molded integrally with the frame 2 to hold the substrate 6. A second connecting portion 52 of the press fit terminal 5 protrudes inward of a fitting portion 24 of the frame 2. The press fit terminal 5 is electrically connected to the electric wire W through a connector fitted to the fitting portion 24.

The upper cover 3 is a cover that covers an upper opening 22a of the frame 2. The lower cover 4 is a cover that covers a lower opening of the frame 2. The fastening member 7 is a member that fastens the lower cover 4, the frame 2, and the upper cover 3 with each other. The fastening member 7 according to this embodiment is a male screw. The fastening member 7 is inserted through the lower cover 4 and the frame 2 and is screwed to a female thread of the upper cover 3. As the upper cover 3 and the lower cover 4 are fastened to the frame 2, the accommodating space 21 becomes a closed space.

As illustrated in FIGS. 2 to 4, the frame 2 is a cylindrical member whose both ends are opened. The frame 2 is molded of an insulation material such as synthetic resin. The frame 2 has a cylindrical side wall portion 22, a holding wall portion 23, and a plurality of fitting portions 24. The side wall portion 22 is a cylindrical member whose both ends are opened. The side wall portion 22 according to this embodiment has a rectangular cylindrical shape with a rectangle cross-sectional shape. Herein, a direction of a center axis line of the side wall portion 22 will be referred to as an "axial direction". In addition, one side of the axial direction of the side wall portion 22 will be referred to as an "upper side", and the other side of the axial direction will be referred to as a "lower side". However, the upper and lower directions are just for convenience purposes, and they may be differently set in some cases when the electrical connection box 1 is mounted on a vehicle or the like in practice.

The upper opening 22a of the side wall portion 22 is an opening serving as an insertion opening of the substrate 6. In the frame 2 according to this embodiment, an end surface 22b on the opening 22a side of the side wall portion 22 is flat. That is, the end surface 22b is positioned coplanar with a plane orthogonal to the axial direction. The upper cover 3 abuts the end surface 22b to cover the opening 22a.

The holding wall portion 23 is a wall portion protruding inward of the accommodating space 21 from the side wall portion 22. In other words, the holding wall portion 23 protrudes toward the center axis line of the side wall portion 22. The holding wall portion 23 protrudes perpendicularly to the axial direction from the lower end of the side wall portion 22. The holding wall portion 23 has an opening 23a. The opening 23a is a lower opening of the frame 2. That is, the holding wall portion 23 according to this embodiment has a rectangular frame shape. The opening 23a is smaller than the substrate 6. In other words, the holding wall portion 23 has a width set such that the holding wall portion 23 overlaps with the substrate 6 as seen in the axial direction. The lower cover 4 abuts a lower end of the side wall portion 22 and the holding wall portion 23 to cover the opening 23a. The upper and lower covers 3 and 4 are formed of an insulating synthetic resin or the like.

The fitting portion 24 is a portion fitted to the connector and protrudes from an outer surface of the side wall portion 22. The fitting portion 24 according to this embodiment is a rectangular cylindrical portion having a rectangular cross-sectional shape. The frame 2 according to this embodiment has three fitting portions 24 provided on different surfaces of the side wall portion 22. The fitting portions 24 have locking portions that locks the connector.

The press fit terminal 5 is a terminal pressedly inserted into a hole 61 of the substrate 6 as described below. The press fit terminal 5 has conductivity and is formed of a metallic material such as copper or aluminum. The press fit terminal 5 according to this embodiment is bent in an L-shape as illustrated in FIG. 5. The press fit terminal 5 has a first connecting portion 51 and a second connecting portion 52. The first connecting portion 51 is a portion provided in one side of a bent portion. The second connecting portion 52 is a portion provided in the other side of the bent portion. The first and second connecting portions 51 and 52 extend in directions intersect with each other. In the press fit terminal 5 according to this embodiment, the first and second connecting portions 51 and 52 are perpendicular to each other.

The first connecting portion 51 is a terminal portion pressedly inserted into the substrate 6 and electrically connected to the substrate 6. As illustrated in FIGS. 6 and 7, the first connecting portion 51 has a pressed insertion portion 53 in its distal end side. The pressed insertion portion 53 has a width larger than that of a portion neighboring to the pressed insertion portion 53 of the first connecting portion 51. The pressed insertion portion 53 according to this embodiment is constituted of a pair of curved portions 53a and 53a. Each of the pair of curved portions 53a and 53a connects a basal end portion of the first connecting portion 51 with respect to the curved portion 53a and a distal end portion with respect to the curved portion 53a. A pair of curved portions 53a and 53a is curved such that they are separated in the width direction from both end sides to the center portions 53b and 53b. The curved portions 53a are formed in an elastically deformable manner.

The second connecting portion 52 is a terminal portion electrically connected to the electric wire W. The second connecting portion 52 protrudes toward the inner space of the fitting portion 24 as illustrated in FIGS. 3 and 4. More specifically, the second connecting portions 52 of the press fit terminals 5 are arranged along two lines and are held by the frame 2 such that they protrude inward of the fitting portion 24. The press fit terminal 5 according to this embodiment is integrated with the frame 2, for example, through insert molding. As the connector is fitted to the fitting portion 24, the second connecting portion 52 is electrically connected to the terminal of the connector. The terminal of the connector is electrically connected to the electric wire W.

Therefore, the press fit terminal 5 is electrically connected to the electric wire W through the connector.

As illustrated in FIGS. 2 and 4, the first connecting portion 51 protrudes from the holding wall portion 23 toward the opening 22*a*. More specifically, the first connecting portions 51 are arranged along two lines and protrude from the holding wall portion 23 into the accommodating space 21. The press fit terminal 5 according to this embodiment is integrated with the frame 2 such that the first connecting portions 51 protrude from the holding wall portion 23 along the axial direction. In the frame 2 according to this embodiment, a group of first connecting portions 51 protrudes from three places of the holding wall portion 23 depending on a position of the fitting portion 24. In the following description, a group of first connecting portions 51 corresponding to a single fitting portion 24 will be referred to as a "connecting portion group 54".

As illustrated in FIGS. 2 and 4, the frame 2 according to this embodiment further has an arm portion 8 and a stopper portion 9. Each of the arm portion 8 and the stopper portion 9 is formed integrally with the holding wall portion 23.

The arm portion 8 protrudes from the holding wall portion 23 toward the opening 22*a*. According to this embodiment, two arm portions 8 are arranged on each of four walls composing the side wall portion 22. The arm portions 8 are arranged in pairs such that one pair of the arm portions 8 oppose each other with the opening 23*a* interposed therebetween. As illustrated in FIG. 2, the arm portion 8 is positioned in each end portion of the width direction of the four walls of the side wall portion 22. In addition, each of the two arm portions 8 on one wall of the side wall portion 22 is arranged in both sides with the connecting portion group 54 interposed therebetween. The arm portions 8 protrude from positions closer to the side wall portion 22 than the first connecting portion 51 of the press fit terminal 5.

As illustrated in FIG. 8, the arm portion 8 has a main body 81 and a hook portion 82. The main body 81 is a plate-shaped or columnar member having flexibility. The main body 81 and the hook portion 82 are formed integrally with the holding wall portion 23. The main body 81 protrudes toward the opening 22*a* from the holding wall portion 23. The main body 81 according to this embodiment is inclined with respect to the axial direction. More specifically, the main body 81 is inclined with respect to the axial direction such that it is directed inward of the accommodating space 21 as it extends from the holding wall portion 23 toward the opening 22*a*. Here, the axial direction is a direction in which the substrate 6 is inserted to the accommodating space 21. Therefore, the main body 81 is inclined with respect to the insertion direction of the substrate 6.

In the frame 2 according to this embodiment, the inner surface 22*c* of the side wall portion 22 is arranged in parallel with the axial direction. Therefore, the main body 81 of the arm portion 8 is inclined so as to be separated from the inner surface 22*c* of the side wall portion 22 as it extends from the holding wall portion 23 toward the opening 22*a*.

The hook portion 82 is provided in a distal end of the main body 81. The hook portion 82 protrudes inward of the accommodating space 21 from the main body 81. That is, the hook portion 82 protrudes from the main body 81 to a side opposite to the neighboring inner surface 22*c* side of the side wall portion 22. The hook portion 82 includes a locking surface 82*a*. The locking surface 82*a* is a surface facing the holding wall portion 23 in the axial direction. The locking surface 82*a* locks the substrate 6 to restrict removal of the substrate 6 from the press fit terminal 5.

The arm portions 8 according to this embodiment are arranged to abut the side wall portion 22 such that their deformation amounts are within an elastic deformation range when they are pressed toward the side wall portion 22. As illustrated in FIG. 9, the arm portion 8 is pressed by the substrate 6 toward the side wall portion 22 when the substrate 6 is inserted into the accommodating space 21. By virtue of the pressing force from the substrate 6, the arm portion 8 is deformed toward the side wall portion 22. In the substrate holding structure 100 according to this embodiment, a relative position between the arm portion 8 and the side wall portion 22 is defined such that no plastic deformation is generated in the arm portion 8 when the distal end of the arm portion 8 is inclined toward the side wall portion 22. As the arm portion 8 is inclined toward the side wall portion 22 side, the distal end of the arm portion 8 abuts the inner surface 22*c* of the side wall portion 22. In this case, a deformation amount of the arm portion 8 is within the elastic deformation range. As the distal end of the arm portion 8 abuts the side wall portion 22, the side wall portion 22 supports the arm portion 8 so that further deformation of the arm portion 8 is restricted. Therefore, it is possible to suppress plastic deformation of the arm portion 8.

The stopper portion 9 protrudes from the holding wall portion 23 toward the opening 22*a*. As illustrated in FIG. 2, the stopper portion 9 is arranged in each corner of the holding wall portion 23. The stopper portion 9 according to this embodiment has a circular columnar shape. As illustrated in FIG. 8, a position of a distal end surface 9*a* of the stopper portion 9 is closer to the holding wall portion 23 than the position of the locking surface 82*a* of the hook portion 82. A distance between the locking surface 82*a* and the distal end surface 9*a* in the axial direction is slightly larger than the thickness of the substrate 6.

The board 6 according to this embodiment is a so-called rigid substrate. The substrate 6 has rigidity as high as the press fit terminal 5 can be pressedly inserted. The substrate 6 according to this embodiment has a rectangular shape as illustrated in FIG. 10. The substrate 6 has a plurality of holes 61. The holes 61 according to this embodiment are through-holes and penetrate the substrate 6 in a thickness direction. The holes 61 have, for example, a circular shape. The holes 61 are formed in three places in the substrate 6. A plurality of holes 61 are arranged along two lines in each place. The positions of the holes 61 match those of the first connecting portions 51 of the press fit terminals 5 of the frame 2. The number of the holes 61 matches the number of the first connecting portions 51. In the following description, a plurality of holes 61 arranged in one place will be referred to as a hole group 62.

The substrate 6 is inserted into the accommodating space 21 of the frame 2 while each hole group 62 faces each connecting portion group 54 of the first connecting portion 51. The insertion direction of the substrate 6 toward the accommodating space 21 is the axial direction. As the substrate 6 is inserted into the accommodating space 21, the first connecting portion 51 of the press fit terminal 5 is inserted into the hole 61 of the substrate 6. The width of the pressed insertion portion 53 of the first connecting portion 51 is larger than the diameter of the hole 61. Therefore, the pressed insertion portion 53 is inserted into the hole 61 while it is elastically deformed. The substrate 6 is inserted into a predetermined position of the accommodating space 21. The predetermined position of the accommodating space 21 will be referred to as a "holding position". The holding position is a predetermined position in the axial direction, that is, a predetermined depth position.

The holding position is a position where a center portion 53b of the pressed insertion portion 53 stops at the center part of the hole 61 in the axial direction. The pressed insertion portion 53 inserted into the hole 61 presses the inner circumferential surface of the hole 61 by virtue of a restoring force so as to hold the substrate 6. A conductor is provided on the inner circumferential surface of the hole 61. The press fit terminal 5 is electrically connected to a circuit of the substrate 6 through this conductor. Since the substrate 6 is supported by a plurality of press fit terminals 5, the substrate 6 is held in the holding position.

The stopper portion 9 restricts the substrate 6 from moving to the back side further than the holding position. The stopper portion 9 is arranged to face the substrate 6 in the axial direction. For example, the stopper portion 9 is configured to abut the substrate 6 when the substrate 6 is inserted to the holding position. In this case, the stopper portion 9 serves as a position determination member for determining the position of the substrate 6 during the insertion. The stopper portion 9 may also be formed to face the substrate 6 placed in the holding position with a predetermined gap.

The arm portion 8 locks the substrate 6 inserted to the holding position to restrict removal of the substrate 6. The arm portions 8 come into contact with side surfaces of the substrate 6 when the substrate 6 is inserted into the accommodating space 21. More specifically, a gap G1 (refer to FIG. 2) between a pair of arm portions 8 facing each other is narrower than the width of the substrate 6. That is, the hook portion 82 of the arm portion 8 is arranged to come into contact with the side surface of the substrate 6. Therefore, the substrate 6 presses the arm portions 8 toward the side wall portion 22 to generate bending deformation of the arm portions 8 toward the side wall portion 22 when the substrate 6 is accommodated in the accommodating space 21. As illustrated in FIG. 9, the arm portion 8 makes bending deformation to allow movement of the substrate 6 toward the holding wall portion 23 side.

As described above, in the substrate holding structure 100 according to this embodiment, the arm portion 8 abuts the side wall portion 22 such that the deformation amount of the arm portion 8 is within the elastic deformation range when the arm portion 8 is pressed toward the side wall portion 22. Therefore, the substrate holding structure 100 according to this embodiment can suppress plastic deformation of the arm portion 8.

As the substrate 6 is further inserted from the state of FIG. 9, the hook portion 82 of the arm portion 8 surmounts the substrate 6. As illustrated in FIG. 11, the arm portion 8 causes the main body 81 to abut on the side surfaces of the substrate 6 by virtue of a restoring force. In addition, the locking surface 82a of the hook portion 82 locks the surface 6a on the opening 22a side of the substrate 6. In the following description, the surface 6a of the opening 22a side of the substrate 6 will be referred to as an "upper surface 6a". The locking surface 82a faces the upper surface 6a in the axial direction. The locking surface 82a locks the upper surface 6a to restrict movement of the substrate 6 when the substrate 6 moves toward the opening 22a side.

As illustrated in FIG. 11, the substrate 6 is supported by the stopper portion 9 from the lower side and is supported by the arm portion 8 from the upper side. The stopper portion 9 and the arm portion 8 restrict the substrate 6 from moving from the holding position in the axial direction to hold the substrate 6 in the holding position. In addition, the arm portion 8 is designed to abut on the side surface of the substrate 6 after the insertion is completed. That is, the arm portion 8 is provided to overlap the substrate 6 after the insertion of the substrate 6 is completed. In other words, the arrangement of the arm portions 8 is defined such that positional tolerances of the arm portions 8 and tolerances of the holes 61 of the substrate 6 can be absorbed.

In the substrate holding structure 100 according to this embodiment, as illustrated in FIG. 11 and the like, all of the arm portions 8 and the press fit terminals 5 are accommodated in the accommodating space 21 and do not protrude from the accommodating space 21. More specifically, the distal end positions of the press fit terminals 5 and the distal end positions of the arm portions 8 are closer to the holding wall portion 23 than the end surface 22b on the opening 22a side of the side wall portion 22. Since the press fit terminals 5 and the arm portions 8 do not protrude to the outside of the accommodating space 21, it is possible to suitably protect the press fit terminals 5 and the arm portions 8. For example, the press fit terminals 5 or the arm portions 8 do not easily interfere with other parts or tools when the electrical connection box is delivered or assembled. Therefore, it is possible to suitably protect the press fit terminals 5 or the arm portions 8 from damage such as deformation.

The arm portion 8 according to this embodiment is inclined with respect to the axial direction such that it is directed to the inward of the accommodating space 21 as it extends from the holding wall portion 23 toward the opening 22a. As a result, a gap G2 between the arm portion 8 and the side wall portion 22 (refer to FIG. 8) is widened as the arm portion 8 extends from the holding wall portion 23 toward the opening 22a. Therefore, it is possible to improve a bridge strength of a die used in molding of the frame 2. Accordingly, it is possible to reduce the gap G2 in the basal end side of the arm portion 8 and position the arm portion 8 close to the side wall portion 22.

As described above, the substrate holding structure 100 according to this embodiment has the side wall portion 22, the holding wall portion 23, a plurality of press fit terminals 5, and the arm portion 8. The side wall portion 22 is formed in a cylindrical shape and forms the accommodating space 21. The holding wall portion 23 protrudes from the side wall portion 22 to the inward of the accommodating space 21. The press fit terminals 5 are held by the holding wall portion 23 and protrude toward the opening 22a of the side wall portion 22. The press fit terminals 5 are pressedly inserted into the holes 61 of the substrate 6 accommodated in the accommodating space 21.

The arm portion 8 protrudes from the position closer to the side wall portion 22 than the press fit terminal 5 in the holding wall portion 23 toward the opening 22a. The arm portion 8 has flexibility and includes the hook portion 82. The hook portion 82 locks the upper surface 6a which is a surface on the opening 22a side of the substrate 6. In the substrate holding structure 100 according to this embodiment, a plurality of press fit terminals 5 are pressedly inserted into the holes 61 of the substrate 6, so that the substrate 6 can be fixed in the holding position. In addition, since the hook portion 82 of the arm portion 8 locks the upper surface 6a of the substrate 6, removal of the substrate 6 can be restricted. Therefore, it is possible to suitably hold the substrate 6 using the substrate holding structure 100 according to this embodiment.

In addition, by pressedly inserting the press fit terminals 5 to the holes 61 of the substrate 6, fixation of the substrate 6 to the frame 2 is completed. Through this pressed insertion process, a locking process for locking the substrate 6 to the arm portions 8 is also completed. In addition, through the pressed insertion process, the press fit terminal 5 and the substrate 6 are electrically connected to each other. Therefore, using the substrate holding structure 100 according to this embodiment, it is possible to simplify the fixation process for fixing the substrate 6 and reduce an assembly work cost. As a comparative example, the substrate 6 may be fixed to the frame 2 by installing screws. In this comparative example, it is necessary to place the substrate 6 in a predetermined position and fasten the screws. For this reason, the manufacturing cost increases due to the cost of the screws and the installation manpower. Using the substrate holding structure 100 according to this embodiment, it is possible to reduce the manufacturing cost, compared to the comparative example.

The distal end positions of the press fit terminal 5 and the arm portion 8 are closer to the holding wall portion 23 than the end surface 22b on the opening 22a side of the side wall portion 22. Since the press fit terminals 5 and the arm portions 8 do not protrude to the outside from the end surface 22b, it is possible to suitably protect the press fit terminals 5 and the arm portions 8.

The substrate holding structure 100 according to this embodiment has the stopper portion 9 that restricts the substrate 6 from moving toward the holding wall portion 23 side further than a predetermined position. The stopper portion 9 supports the substrate 6 from the side opposite to the hook portion 82 side by interposing the substrate 6. Since the substrate 6 is supported by both the hook portion 82 and the stopper portion 9 in this manner, it is possible to suitably hold the substrate 6.

The arm portion 8 according to this embodiment is inclined with respect to the insertion direction of the substrate 6 into the accommodating space 21 such that they are directed to the inward of the accommodating space 21 as they extend from the holding wall portion 23 toward the opening 22a. Therefore, it is possible to absorb positional tolerances of the arm portions 8 or tolerances of the holes 61 of the substrate 6. In addition, compared to a case where the arm portions 8 are not inclined, it is possible to arrange the basal end of the arm portion 8 close to the side wall portion 22.

The arm portion 8 according to this embodiment abuts the side wall portion 22 such that the deformation amount of the arm portion 8 is within the elastic deformation range when the arm portion 8 is pressed toward the side wall portion 22. Therefore, it is possible to suppress plastic deformation in the arm portion 8.

The electrical connection box 1 according to this embodiment has the side wall portion 22, the holding wall portion 23, the press fit terminal 5, the arm portion 8, and the upper cover 3 that covers the opening 22a as described above. The electrical connection box 1 according to this embodiment further has the lower cover 4. Therefore, the accommodating space 21 is covered from both sides in the upper and lower directions. Using the electrical connection box 1 according to this embodiment, it is possible to suitably hold the substrate 6 or suitably protect the press fit terminal 5 and the arm portion 8.

Modification

The arrangements, the numbers, the shapes, and the like of the press fit terminal 5, the arm portion 8, the stopper portion 9, and the like are not limited to those described above. In addition, the shape of the frame 2 or the substrate 6 is not limited to those described above. For example, the cross-sectional shape of the frame 2 may be polygonal and the like instead of rectangular. A plurality of substrates 6 may also be held by the frame 2.

The embodiments and the modifications described above may be combined with each other as appropriate.

According to an aspect of the embodiment, there is provided a substrate holding structure including: a cylindrical side wall portion that forms an accommodating space; a holding wall portion protruding inward of the accommodating space from the side wall portion; a plurality of press fit terminals held by the holding wall portion, protruding toward an opening of the side wall portion, and pressedly inserted into holes of a substrate accommodated in the accommodating space; and a flexible arm portion protruding toward the opening from a position closer to the side wall portion than the press fit terminals of the holding wall portion, and having a hook portion configured to lock a surface on the opening side of the substrate. The distal end positions of the press fit terminals and the arm portion are closer to the holding wall portion than an end surface on the opening side of the side wall portion.

In the substrate holding structure according to the embodiment, a plurality of press fit terminals pressedly inserted into the holes of the substrate hold the substrate. In addition, the arm portion locks the surface on the opening side of the substrate. Therefore, it is possible to suitably hold the substrate using the substrate holding structure according to the embodiment.

In the substrate holding structure according to the embodiment, the press fit terminal and the arm portion do not protrude toward the outside relative to the end surface of the opening side. Therefore, the press fit terminal and the arm portion do not easily interfere with other parts or tools. Therefore, using the substrate holding structure according to the embodiment, it is possible to suitably protect the substrate holding portion.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate holding structure comprising:
a cylindrical side wall portion that forms an accommodating space;
a holding wall portion protruding inward of the accommodating space from the side wall portion;
a plurality of press fit terminals held by the holding wall portion, protruding toward an opening of the side wall portion, and pressedly inserted into holes of a substrate accommodated in the accommodating space; and
a flexible arm portion protruding toward the opening from a position closer to the side wall portion than the press fit terminals of the holding wall portion, and having a hook portion configured to lock a surface on the opening side of the substrate, wherein
distal end positions of the press fit terminals and the arm portion are located closer to the holding wall portion than an end surface on the opening side of the side wall portion.

2. The substrate holding structure according to claim 1, further comprising:
a stopper portion that restricts movement of the substrate toward the holding wall portion side beyond a predetermined position.

3. The substrate holding structure according to claim 1, wherein
the arm portion is inclined with respect to an insertion direction of the substrate toward the accommodating space such that the arm portion is directed inward of the accommodating space as it extends from the holding wall portion toward the opening.

4. The substrate holding structure according to claim 2, wherein
the arm portion is inclined with respect to an insertion direction of the substrate toward the accommodating space such that the arm portion is directed inward of the accommodating space as it extends from the holding wall portion toward the opening.

5. The substrate holding structure according to claim 1, wherein
the arm portion abuts the side wall portion in a state where a deformation amount of the arm portion is within an elastic deformation range when the arm portion is pressed toward the side wall portion.

6. The substrate holding structure according to claim 2, wherein
the arm portion abuts the side wall portion in a state where a deformation amount of the arm portion is within an elastic deformation range when the arm portion is pressed toward the side wall portion.

7. The substrate holding structure according to claim 3, wherein
the arm portion abuts the side wall portion in a state where a deformation amount of the arm portion is within an elastic deformation range when the arm portion is pressed toward the side wall portion.

8. The substrate holding structure according to claim 4, wherein
the arm portion abuts the side wall portion in a state where a deformation amount of the arm portion is within an elastic deformation range when the arm portion is pressed toward the side wall portion.

\* \* \* \* \*